(12) United States Patent
Liu et al.

(10) Patent No.: US 8,363,442 B2
(45) Date of Patent: Jan. 29, 2013

(54) NAND BASED RESISTIVE SENSE MEMORY CELL ARCHITECTURE

(75) Inventors: Harry Hongyue Liu, Maple Grove, MN (US); Haiwen Xi, San Jose, CA (US); Antoine Khoueir, Apple Valley, MN (US); Song Xue, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 196 days.

(21) Appl. No.: 12/903,716

(22) Filed: Oct. 13, 2010

(65) Prior Publication Data

US 2011/0032749 A1 Feb. 10, 2011

Related U.S. Application Data

(63) Continuation of application No. 12/269,656, filed on Nov. 12, 2008, now Pat. No. 7,830,693.

(51) Int. Cl.
*G11C 5/02* (2006.01)

(52) U.S. Cl. ....... 365/51; 365/63; 365/148; 365/185.05; 365/185.17

(58) Field of Classification Search ................... 365/100
See application file for complete search history.

(56) References Cited

U.S. PATENT DOCUMENTS

| | | | |
|---|---|---|---|
| 7,002,837 B2 | 2/2006 | Morimoto | |
| 7,221,588 B2 | 5/2007 | Fasoli et al. | |
| 7,224,601 B2 | 5/2007 | Panchula | |
| 7,251,152 B2 | 7/2007 | Roehr | |
| 7,298,640 B2 | 11/2007 | Chen et al. | |
| 7,382,651 B2 | 6/2008 | Nagao et al. | |
| 7,414,879 B2 | 8/2008 | Asao et al. | |
| 7,817,454 B2 * | 10/2010 | Liu | 365/63 |
| 7,830,693 B2 * | 11/2010 | Liu et al. | 365/51 |
| 2007/0121369 A1 * | 5/2007 | Happ | 365/148 |

* cited by examiner

*Primary Examiner* — Tan T. Nguyen
(74) *Attorney, Agent, or Firm* — Hall Estill, et al.

(57) ABSTRACT

Various embodiments are directed to an apparatus comprising a semiconductor memory array with non-volatile memory unit cells arranged into a NAND block. Each of the unit cells comprises a resistive sense element connected in parallel with a switching element. The resistive sense elements are connected in series to form a first serial path, and the switching elements are connected in series to form a second serial path parallel to the first serial path. Each resistive sense element is serially connected to an adjacent resistive sense element in the block by a tortuous conductive path having a portion that extends substantially vertically between said elements to provide operational isolation therefor.

20 Claims, 6 Drawing Sheets

NAND BASED RESISTIVE SENSE MEMORY CELL ARCHITECTURE

BACKGROUND

Data storage devices generally operate to store and retrieve data in a fast and efficient manner. Some storage devices utilize a semiconductor array of solid-state memory cells to store individual bits of data. Such memory cells can be volatile or non-volatile. Volatile memory cells generally retain data stored in memory only so long as operational power continues to be supplied to the device. Non-volatile memory cells generally retain data stored in memory even in the absence of the application of operational power.

So-called resistive sense memory (RSM) cells can be configured to have different electrical resistances to store different logical states. The resistance of the cells can be subsequently detected during a read operation by applying a read current and sensing a signal in relation to a voltage drop across the cell. Exemplary types of RSM cells include resistive random access memory (RRAM), magnetic random access memory (MRAM), and spin-torque transfer random access memory (STTRAM or STRAM).

SUMMARY

Various embodiments of the present invention are generally directed to an apparatus generally comprising a semiconductor memory array with non-volatile memory unit cells arranged into a NAND block.

In accordance with some embodiments, the apparatus generally comprises serially connected memory unit cells to form a NAND block, each of the unit cells comprising a resistive sense element connected in parallel with a switching element. The resistive sense elements are connected in series to form a first serial path, and the switching elements are connected in series to form a second serial path parallel to the first serial path. Each resistive sense element is serially connected to an adjacent resistive sense element in the block by a tortuous conductive path having a portion that extends substantially vertically between said elements to provide operational isolation therefor.

In accordance with other embodiments, the apparatus generally comprises serially connected memory unit cells, each unit cell comprising a resistive sense element connected in parallel with a switching element, and first means for connecting the unit cells into a NAND block to operationally isolate each of the resistive sense elements within said block.

These and various other features and advantages which characterize the various embodiments of the present invention can be understood in view of the following detailed discussion in view of the accompanying drawings.

DETAILED DESCRIPTION

Figure 1:
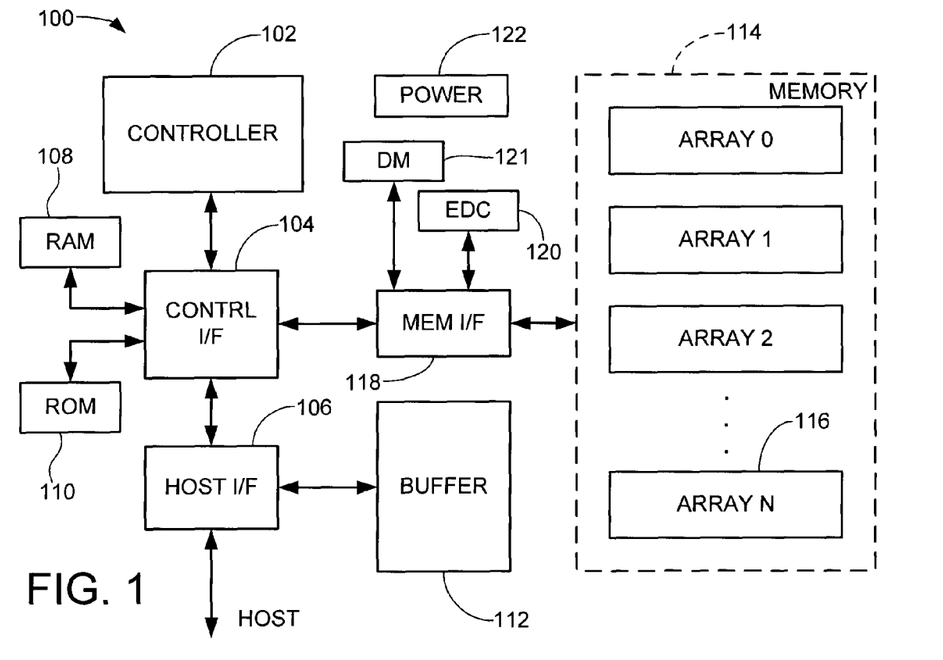
FIG. 1 is a generalized functional representation of an exemplary data storage device constructed and operated in accordance with various embodiments of the present invention.

FIG. 1 provides a functional block representation of a data storage device 100 constructed and operated in accordance with various embodiments of the present invention. The data storage device is contemplated as comprising a portable non-volatile memory storage device such as a PCMCIA card or USB-style external memory device. It will be appreciated, however, that such characterization of the device 100 is merely for purposes of illustration and is not limiting to the claimed subject matter.

Top level control of the device 100 is carried out by a suitable controller 102, which may be a programmable or hardware based microcontroller. The controller 102 communicates with a host device via a controller interface (I/F) circuit 104 and a host I/F circuit 106. Local storage of requisite commands, programming, operational data, and the like is provided via random access memory (RAM) 108 and read-only memory (ROM) 110. A buffer 112 serves to temporarily store input write data from the host device and readback data pending transfer to the host device, as well as to facilitate serialization/deserialization of the data during a transfer operation. The buffer can be located in any suitable location, including in a portion of the array.

A memory space is shown at 114 to comprise a number of memory arrays 116 (denoted Array 0-N), although it will be appreciated that a single array can be utilized as desired. Each array 116 preferably comprises a block of semiconductor memory of selected storage capacity. Communications between the controller 102 and the memory space 114 are coordinated via a memory (MEM) I/F 118. As desired, on-the-fly error detection and correction (EDC) encoding and decoding operations are carried out during data transfers by way of an EDC block 120, and defect management (DM) functions are carried out by block 121.

While not limiting, in an embodiment the various circuits depicted in FIG. 1 are arranged as a single chip set formed on one or more semiconductor dies with suitable encapsulation, housing and interconnection features (not separately shown for purposes of clarity). Input power to operate the device is handled by a suitable power management circuit 122 and is supplied from a suitable source such as from a battery or AC power input. Power can also be supplied to the device 100 directly from the host such as through the use of a USB-style interface.

Any number of data storage and transfer protocols can be utilized, such as logical block addressing (LBAs) whereby data are arranged and stored in fixed-size blocks (such as 512 bytes of user data plus overhead bytes for ECC, sparing and header information). Host commands can be issued in terms of LBAs, and the device 100 can carry out a corresponding LBA-to-PBA (physical block address) conversion to identify and service the associated locations at which the data are to be stored or retrieved. These and other features will be discussed in detail below.

Figure 2:
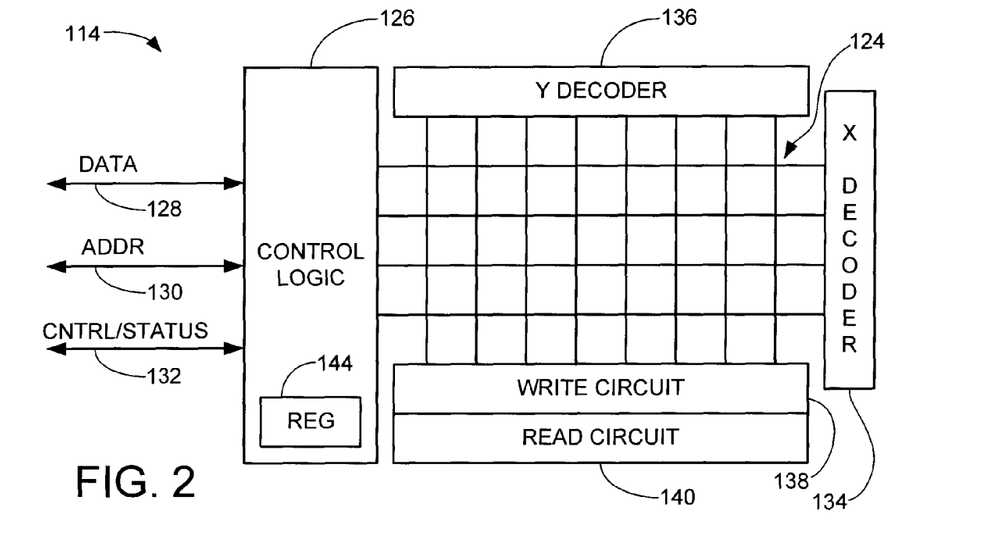
FIG. 2 shows circuitry used to read data from and write data to a memory array of the device of FIG. 1.

FIG. 2 provides a generalized representation of selected aspects of the memory space 114 of FIG. 1. Data are stored in each array as an arrangement of rows and columns of memory cells 124, accessible by various row (word) and column (bit) lines. The actual configurations of the cells and the access lines thereto will depend on the requirements of a given application. Generally, however, it will be appreciated that the various control lines will include enable lines that selectively enable and disable the respective writing and reading of the value(s) of the individual cells.

Control logic 126 receives and transfers data, addressing information and control/status values along multi-line bus paths 128, 130 and 132, respectively. X and Y decoding circuitry 134, 136 provide appropriate switching and other functions to access the appropriate cells 124. As desired, adjacent arrays can be configured to share a single Y (row) decoder 136 to reduce RC delay effects along an associated word line.

A write circuit 138 represents circuitry elements that operate to carry out write operations to write data to the cells 124, and a read circuit 140 correspondingly operates to obtain readback data from the cells 124. Local buffering of transferred data and other values can be provided via one or more local registers 144. At this point it will be appreciated that the circuitry of FIG. 2 is merely exemplary in nature, and any number of alternative configurations can readily be employed as desired depending on the requirements of a given application.

The memory cells 124 are characterized as so-called resistive sense memory (RSM) cells. As used herein, RSM cells are generally described as cells configured to have different electrical resistances which are used to store different logical states. The resistance of the cells can be subsequently detected during a read operation by applying a read current and sensing a signal in relation to a voltage drop across the cell. Exemplary types of RSM cells include resistive random access memory (RRAM), magnetic random access memory (MRAM), spin-torque transfer random access memory (STTRAM or STRAM), etc.

Figure 3:
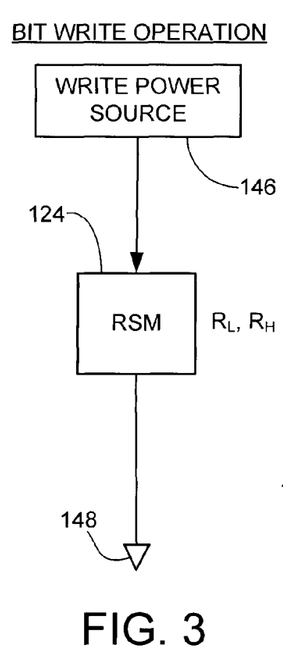
FIG. 3 generally illustrates a manner in which data may be written to a memory cell of the memory array.

Advantages of RSM cells over other types of non-volatile memory cells such as EEPROM and flash include the fact that no floating gate is provided in the cell construction. No erase operation is necessary prior to the writing of new data to an existing set of cells. Rather, RSM cells can be individually accessed and written to any desired logical state (e.g., a "0" or "1") irrespective of the existing state of the RSM cell. Also, write and read power consumption requirements are substantially reduced, significantly faster write and read times can be achieved, and substantially no wear degradation is observed as compared to erasable cells, which have a limited write/erase cycle life. Data are written to the respective RSM memory cells 124 as generally depicted in FIG. 3. A write power source 146 applies the necessary input (such as in the form of a current, a voltage, a magnetization) to configure the memory cell 124 to a desired state. It can be appreciated that FIG. 3 is merely a representative illustration of a bit write operation.

The configuration of the write power source 146, memory cell 124, and reference node 148 can be suitably manipulated to allow the writing of data to the array. Depending on the orientation of the applied power, the cell 124 may take either a relatively low resistance ($R_L$) or a relatively high resistance ($R_H$). While not limiting, exemplary $R_L$ values may be in the range of about 100 ohms (Ω) or so, whereas exemplary $R_H$ values may be in the range of about 100KΩ or so. These values are retained by the respective cells until such time that the state is changed by a subsequent write operation. While not limiting, in the present example it is contemplated that a high resistance value ($R_H$) denotes storage of a logical 1 by the cell 124, and a low resistance value ($R_L$) denotes storage of a logical 0.

Figure 4:
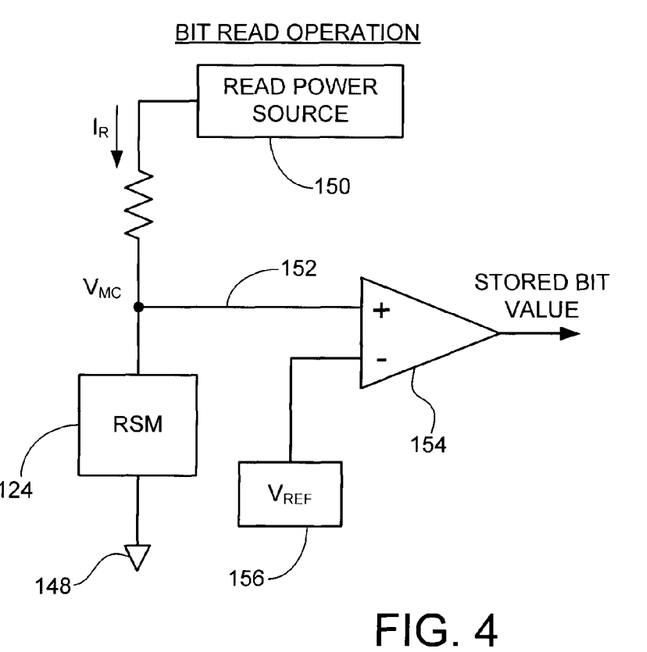
FIG. 4 generally illustrates a manner in which data may be read from the memory cell of FIG. 3.

The logical bit value(s) stored by each cell 124 can be determined in a manner such as illustrated by FIG. 4. A read power source 150 applies an appropriate input (e.g., a selected read voltage) to the memory cell 124. The amount of read current $I_R$ that flows through the cell 124 will be a function of the resistance of the cell ($R_L$ or $R_H$, respectively). In the case of STRAM, as well as other types of memory configurations such as RRAM, the read current magnitude will be generally be significantly lower than the write current magnitude utilized to set the storage state of the bit. The voltage drop across the memory cell (voltage $V_{MC}$) is sensed via path 152 by the positive (+) input of a comparator 154. A suitable reference (such as voltage reference $V_{REF}$) is supplied to the negative (−) input of the comparator 154 from a reference source 156.

The reference voltage $V_{REF}$ is preferably selected such that the voltage drop $V_{MC}$ across the memory cell 124 will be lower than the $V_{REF}$ value when the resistance of the cell is set to $R_L$, and will be higher than the $V_{REF}$ value when the resistance of the cell is set to $R_H$. In this way, the output voltage level of the comparator 154 will indicate the logical bit value (0 or 1) stored by the memory cell 124. The reference voltage can be generated and supplied externally, or can be generated locally using dummy reference cells or a self-reference operation, as desired.

Figures 5, 6:
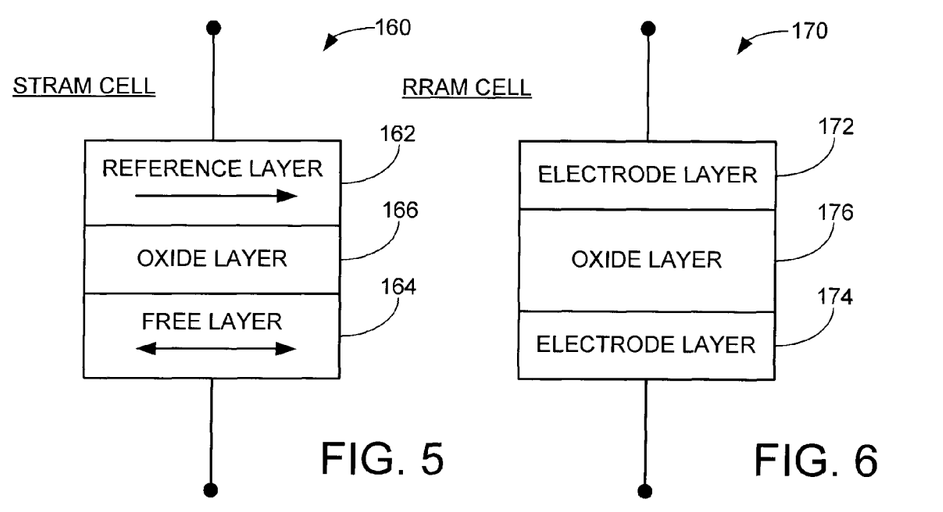
FIG. 5 shows an exemplary construction of a resistive sense memory (RSM) cell characterized as a spin-torque transfer random access memory (STTRAM or STRAM) cell.
FIG. 6 shows an exemplary construction of a resistive sense memory (RSM) cell characterized as a resistive random access memory (RRAM) cell.

FIG. 5 generally illustrates a magnetic tunneling junction (MTJ) 160 of a selected one of the RSM memory cells 124, characterized as an STRAM memory cell. The MTJ includes two ferromagnetic layers 162, 164 separated by an oxide barrier layer 166 (such as magnesium oxide, MgO). The resistance of the MTJ 160 is determined in relation to the relative magnetization directions of the ferromagnetic layers 162, 164: when the magnetization is in the same direction (parallel), the MTJ is in the low resistance state ($R_L$); when the magnetization is in opposite directions (anti-parallel), the MTJ is in the high resistance state ($R_H$).

In some embodiments, the magnetization direction of the reference layer 162 is fixed by coupling to a pinned magnetization layer (e.g., a permanent magnet, etc.), and the magnetization direction of the free layer 164 can be changed by passing a driving current polarized by magnetization in the reference layer 162. To read the logic state stored by the MTJ 160, a relatively small current is passed through the MTJ between a source line (SL) and a bit line (BL). Because of the difference between the low and high resistances of the MTJ in the respective logical 0 and 1 states, the voltage at the bit line will be different, and this is sensed as set forth above in FIG. 4.

FIG. 6 generally illustrates an alternative embodiment of the RSM cells 124 in which an RRAM construction is used. An RRAM cell 170 includes opposing electrode layers 172, 174 and an oxide layer 176. The oxide layer 176 may be configured to have a nominally high resistance (e.g., $R_H$). The resistance of the oxide layer, however, can be lowered (e.g., $R_L$) through application of a relatively high write voltage across the RRAM cell 170. Such voltage generates lower resistance paths (filaments) as components of a selected electrode layer 172, 174 migrate into the oxide layer 176.

The oxide layer 176 can be restored to its original, higher resistance through application of a corresponding voltage of opposite polarity. As with the MTJ 160 of FIG. 5, the storage state of the RRAM cell 170 of FIG. 6 can be read by passing a read current from a source line (SL) to a bit line (BL), and sensing the resistance of the cell in a manner such as shown in FIG. 4.

In some embodiments, each RSM memory cell 124 stores a single logical bit value (e.g., 0 or 1) in relation to the resistive state of the associated cell. In other embodiments, each memory cell 124 is configured to store multiple bits. For example, a memory cell configured to provide four different statuses (e.g., four different resistance levels R0 to R3), this cell can be used to store two bits (e.g., R0=00; R1=01; R2=10; R3=11). More generally, if a memory cell can store $2^N$ different statuses, it can be used to store up to N bits. For clarity of illustration, the following discussion will contemplate the use of single-bit storage configuration for the memory cells 124, and modifications to accommodate multi-bit storage configurations will readily occur to the skilled artisan in view thereof.

Figure 7:
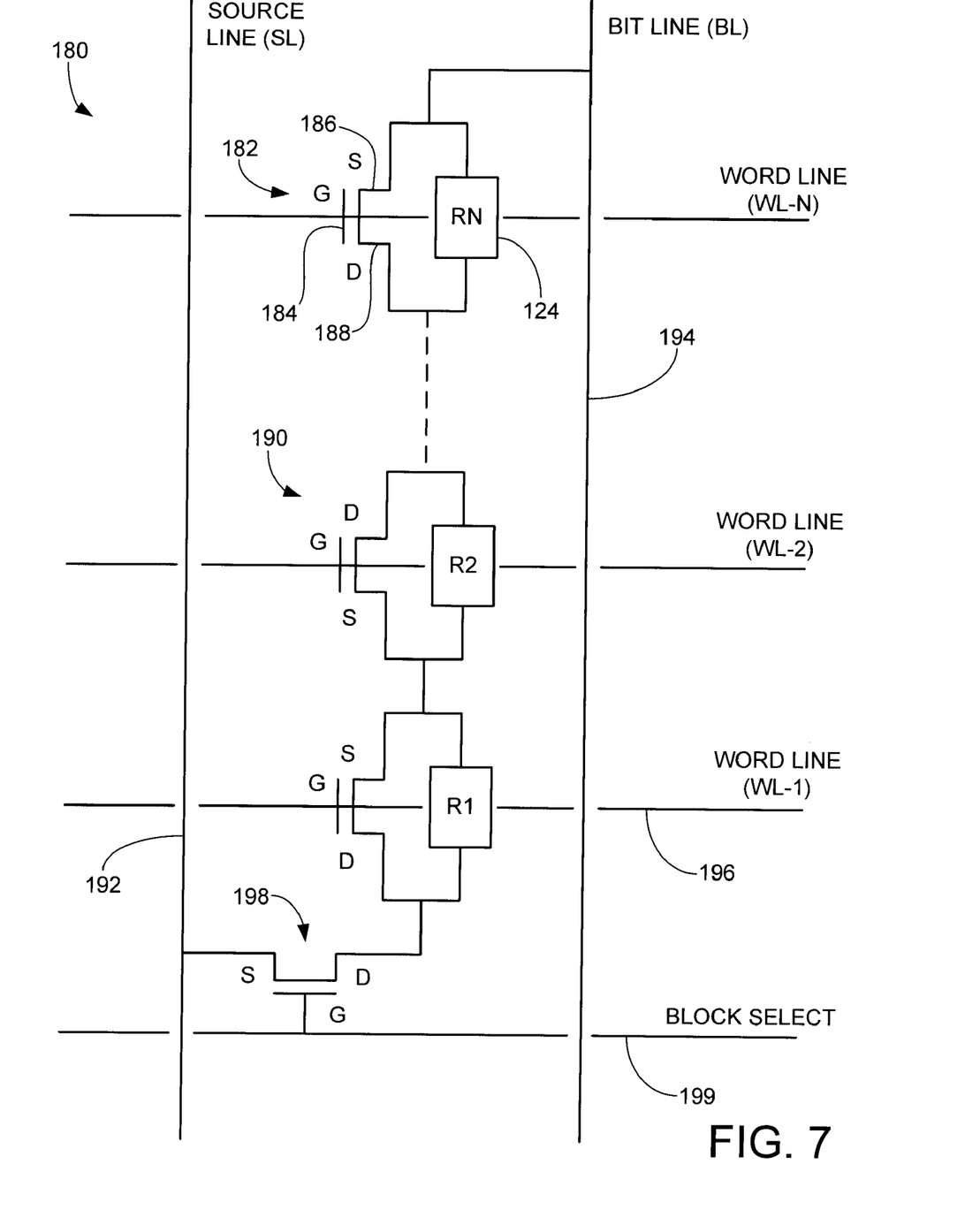
FIG. 7 provides a schematic representation of a NAND based block of memory cells in accordance with various embodiments.

FIG. 7 provides a schematic representation of a number of RSM cells 124 (cells 1 to N) that have been grouped together into a NAND based block 180. Each of the RSM cells 124 has a corresponding switching element 182 connected in parallel with the cell. Each switching element 182 is characterized as a field effect transistor with respective gate (G) 184, source (S) 186 and drain (D) 188 regions, although other configurations for the switching elements can be utilized as desired. For reference, the cells 124 are also referred to herein as "resistive sense elements."

Adjacent switching elements 182 share common source/drain regions in the configuration of FIG. 7. While not limiting, in some embodiments the respective transistors are characterized as n-type MOSFETs which are normally nonconductive from source to drain in a deactivated state, and become conductive when a suitable gate control voltage is applied.

Each cell/switching element pair 124, 182 is referred to herein as a unit cell 190. The unit cells 190 are connected in series between a source line (SL) 192 and a bit line (BL) 194. This connection arrangement places the RSM cells 124 in a first serial path between the SL 192 and the BL 194. A second serial path between the SL 192 and the BL 194 is formed by the switching elements 182, with the second serial path in parallel with the first path.

Word lines (WL) 196 denoted WL-1 to WL-N are coupled to the respective gates 184 of the switching elements 182. In some embodiments, the SL 192 and BL 194 extend in parallel fashion across the array 116 in a first direction (e.g., the y-direction). The WLs 196 extend in parallel fashion across the array 116 in a second direction (e.g., the x-direction) normal to the first direction.

A block select switching element 198, also characterized as a field effect transistor, is arranged in series between the unit cells 190 and the SL 192. A block select line 199 extends across the array 116 in the second direction and is coupled to the gate 184 of the block select switching element 198. In some embodiments, multiple adjacent blocks are arranged within the array 116, each having its own switching element and select line to enable each block to be individually selected in turn.

A manner in which a particular RSM cell 124 can be accessed will now be described, using the "RSM 1" cell as an example. First, the associated block select switching element 198 is asserted by application of a suitable control voltage from the block select line 199 to the associated gate 184. This places the switching element 198 in a conductive state. Word lines WL-2 through WL-N are provided with suitable control voltages to place the switching elements 182 of the non-selected unit cells 190 (RSM 2-N) into conductive states. The word line WL-1 remains unactivated, so that the switching element 182 adjacent RSM 1 remains in a nonconductive state.

To read the resistance state of the RSM 1 cell, a read current is passed from the source line SL 192, through the block select switching element 198, through the RSM 1 cell, and through the lower resistance switching elements 182 for cells 2-N to the bit line 194. A sense amplifier (such as 154 in FIG. 4) is connected to the bit line 194 to sense the associated resistance of the RSM 1 cell. Each of the resistance values of the remaining cells can be sequentially sensed in this manner by appropriately configuring the word lines 196.

The resistance of the RSM 1 cell is written to a desired state by maintaining the above select line and word line configuration, and then applying the appropriate current and/or voltage between the source line 192 and the bit line 194. Charge pumps or other techniques can be utilized to ensure sufficient voltage is present at the gates 184 of the conductive switching elements 2-N. In other embodiments, the switching elements 182 can be alternately configured to be normally conductive, in which case the word line for the selected cell (in this case, word line WL-1) is provided with a suitable control voltage to render the associated transistor in a non-conductive state while the remaining word lines WL-2 through WL-N are unactivated.

The NAND based arrangement of RSM cells as set forth by FIG. 7 provides several advantages over prior arrangements, including fast read and writes, low power consumption, good scaling capabilities and increased memory cell densities. It is contemplated that unit cell geometries on the order of $4F^2$ (2F×2F) can be achieved, where F is a minimum feature dimension of a given manufacturing process.

Figure 8:
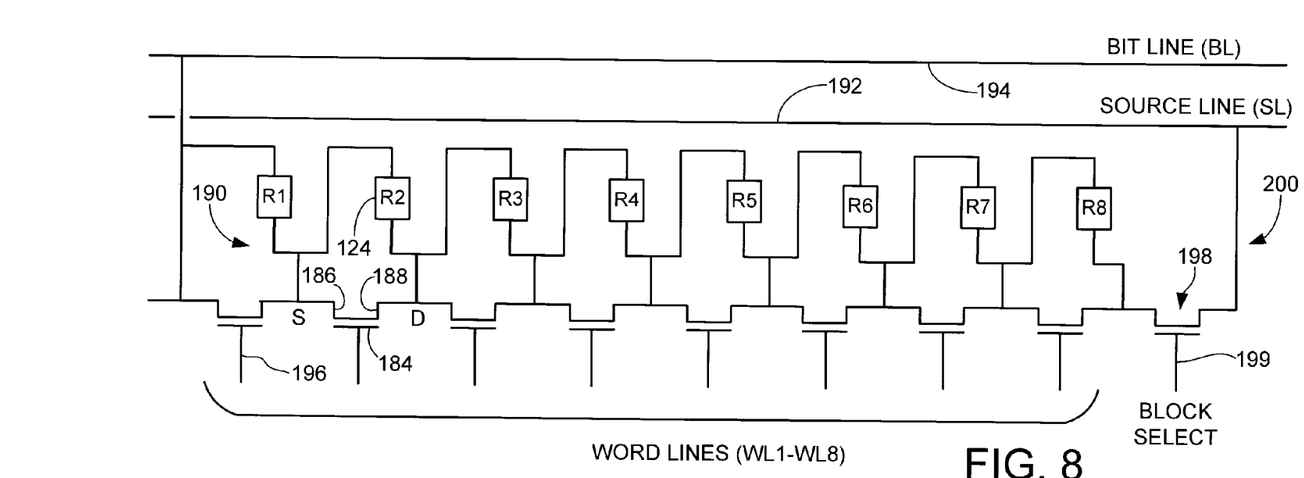
FIG. 8 provides another schematic arrangement of FIG. 7.

FIG. 8 provides another schematic representation for a NAND block 200 generally similar to the block 180 of FIG. 7. As before, the block 200 includes a number of unit cells 190, in this case 8, each comprising an RSM cell 124 in parallel with a switching element 182. It will be appreciated that the exemplary NAND blocks 180, 200 set forth herein can comprise any number of unit cells, including but not limited to an entire addressable sector's worth of cells, where a sector corresponds to a host level logical block address (LBA), etc. For reference, the RSM cells are denoted from R1 to R8.

Figure 9:
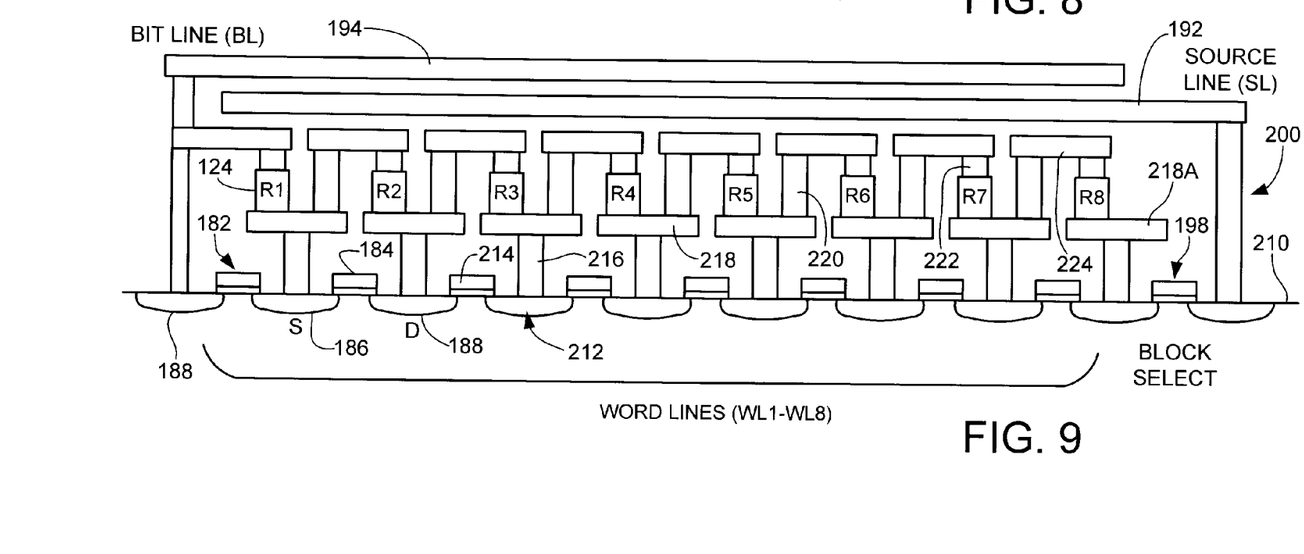
FIG. 9 provides a corresponding side elevational layout representation of the circuitry of FIG. 8.

FIG. 9 shows a corresponding cross-sectional representation of a portion of a selected array 116 that generally corresponds to the schematic of FIG. 8. Like reference numerals are utilized in FIGS. 8-9 to denote corresponding structures. A base substrate of semiconductor material is denoted at 210. Localized n+ doped regions are identified at 212 to alternately form the aforementioned shared source and drain regions 186, 188 for adjacent switching devices 182. Isolated gate electrodes 214 span adjacent doped regions 212 to form the aforementioned gates 184 of the switching devices 182. Although not shown in FIG. 9, it will be appreciated that the respective word lines 198 of FIG. 8 are aligned with and coupled to the gate electrodes 214.

Conductive support structures 216 extend upwardly in a substantially vertical fashion from each of the doped regions 212 to substantially horizontal conductive contact structures 218. Each pair of adjacent structures 216, 218 generally forms a t-shaped conductive path, with the contact structures 218 each forming a "cross-bar" electrode for each t-shaped structure. The RSM cells 124 are formed adjacent a first end of each of the cross-bar structures 218. Second conductive support structures 220 extend upwardly from an opposing second end of each of the cross-bar structures 218, except for a last structure 218A at the far right of FIG. 9 adjacent the block select transistor 198, which does not support a second conductive support structure 220.

Third conductive contact structures 222 extend upwardly from each RSM cell 124, as shown. The third conductive contact structures 222 may not be necessary in situations where the heights of the RSM cells are nominally equal to the heights of the second conductive support structures 220. A second set of substantially horizontal conductive contact structures 224 (electrodes) bridge across adjacent ones of the second support structures 220 and the RSM cells/third contact structures 124, 222.

Other configurations of the unit cells 190 are readily envisioned and will occur to the skilled artisan in view of the present discussion, so the configuration of FIG. 9 is exemplary and not necessarily limiting to the scope of the claimed subject matter.

Nevertheless, it will be appreciated that the configuration of FIG. 9 provides n resistive cells 124 (in this case, n=8) that are serially connected by n−1 (in this case, n−1=7) intervening tortuous conductive paths.

Figure 10:
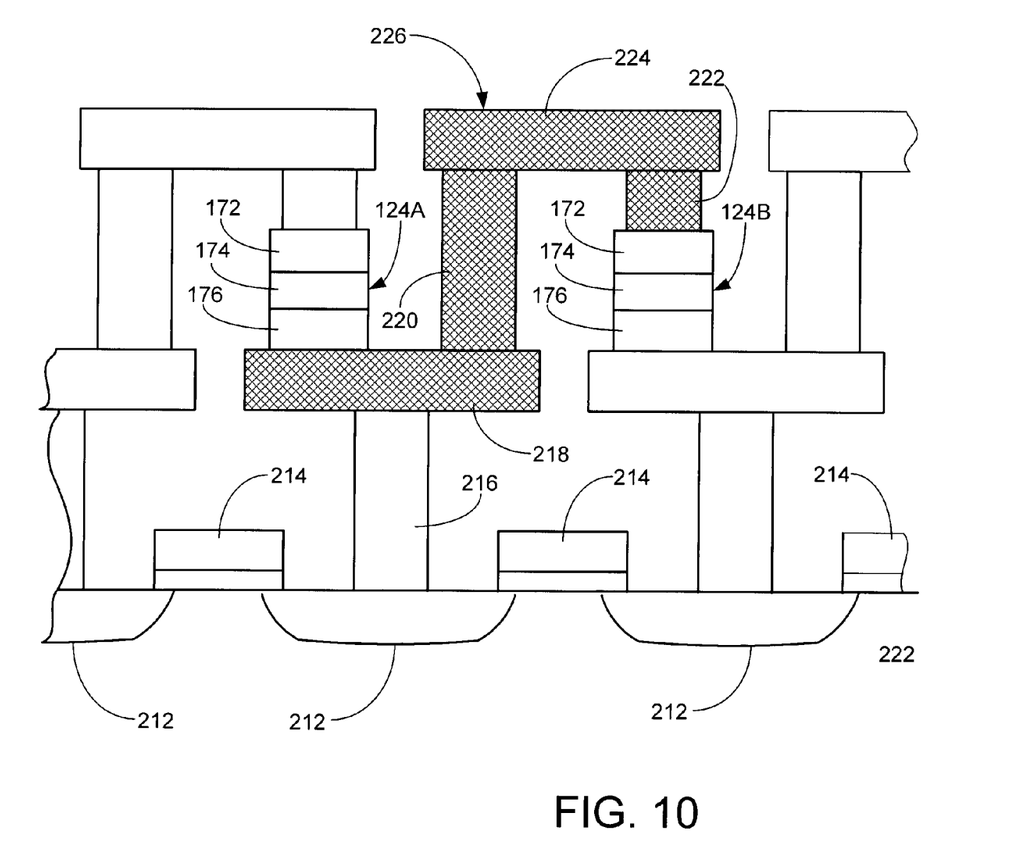
FIG. 10 shows a portion of the layout representation of FIG. 9 in greater detail.

FIG. 10 shows a portion of the structure of FIG. 9 in greater detail. In FIG. 10, the resistive sense memory cells 124 are characterized as taking the RRAM configuration of FIG. 6, although as noted above, other cell configurations can be utilized. An exemplary one of the tortuous conductive paths is denoted in cross-hatch fashion at 226, and includes the first and second electrode layers 218, 224 and the second and third support structures 220, 224. This path 226 takes a substantially z-shape and connects the lower RRAM electrode 176 of cell 124A to the upper RRAM electrode 172 of cell 124B.

In this way, each path 226 has a portion that extends substantially vertically between adjacent cells to operationally isolate the cells one from another, by serving as a high current density shielding layer between the adjacent cells. With reference again to FIG. 9, it will be noted that each individual cell has these conductive isolation layers between itself and the respective, immediately adjacent cells in the block 200, the isolation layers extending upwardly across and beyond the common height of the respective cells.

Figure 11:
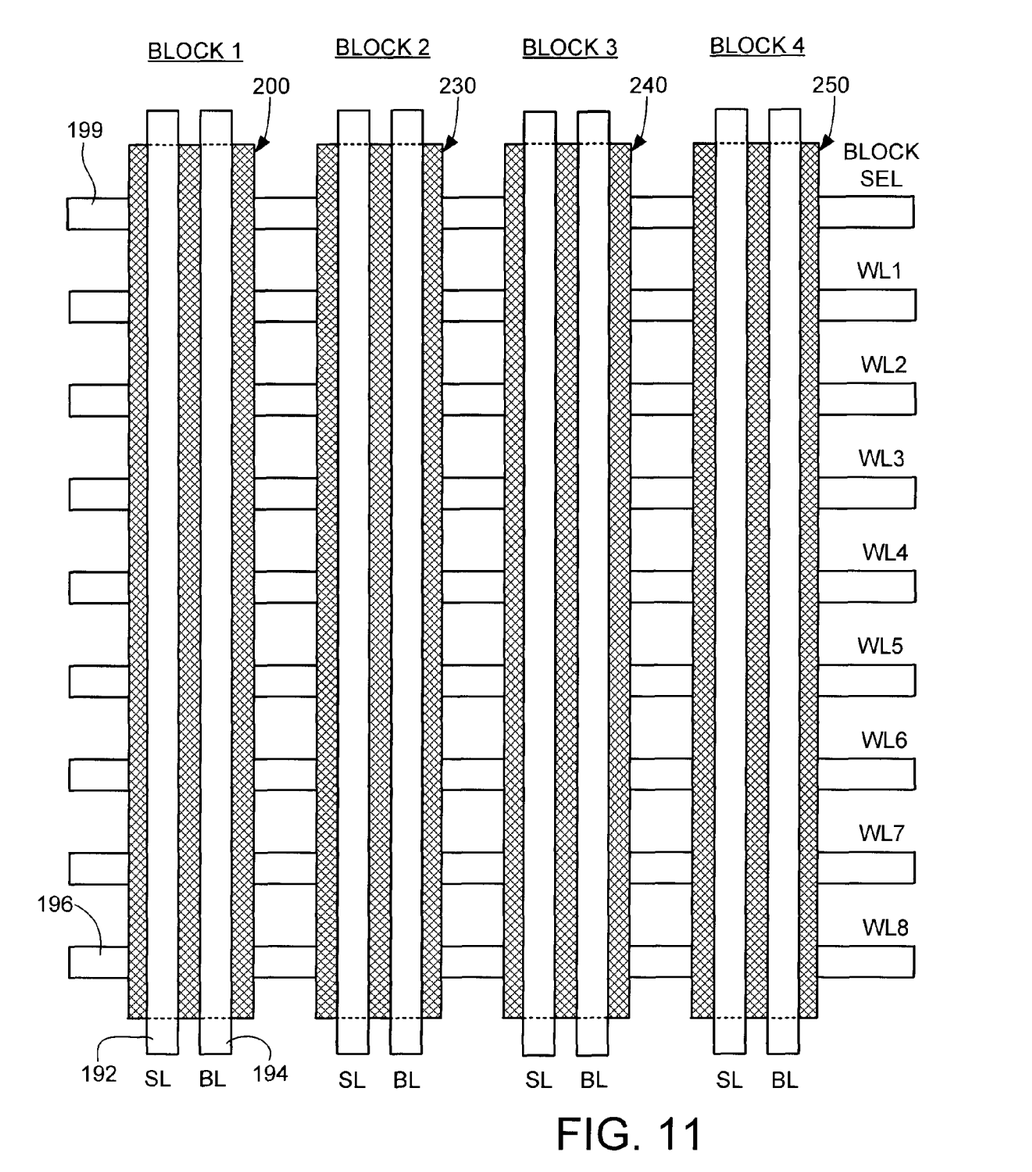
FIG. 11 provides a top plan representation of the layout of FIG. 9.

FIG. 11 shows a top plan representation of the block 200 of FIG. 9 in conjunction with additional adjacent blocks 230, 240 and 250 (respectively denoted as BLOCKS 1-4). Word lines 196 WL1-WL8 extend in the x-direction in spaced apart relation as shown. Block select lines 199 for the BLOCKS 1-4 also run along the x-direction and can be stacked in the vertical direction (with associated isolation layers therebetween). Source lines SL 192 and bit lines BL 194 are shown side-by-side for each of the BLOCKS 1-4, but these can also be stacked in the vertical direction as desired.

It will now be appreciated that various embodiments presented herein provide a number of advantages over the prior art. The exemplary architectures of FIGS. 7-10 provide substantially improves operational isolation of each RSM cell 124. Only a single RSM cell is coupled to each of the electrode structures 218, so the application of write currents and/or voltages to a selected RSM cell are not presented to an immediately adjacent cell that shares the same electrode as the selected cell.

A vertically extending conductive structure 220 is interposed between each adjacent pair of the RSM cells, which further advantageously serves to shield electrical or magnetic fields applied to a given cell from affecting adjacent cells, as well as serves to provide improved conductivity paths to each cell.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A semiconductor stack, comprising:
   first and second horizontal conductive contact structures supported in spaced-apart relation above a base semiconductor substrate;
   first and second resistive sense elements respectively supported on the first and second horizontal conductive contact structures, the first and second resistive sense elements forming a portion of a NAND block of nonvolatile memory unit cells in a semiconductor memory array;
   a conductive support structure that extends upwardly from the first horizontal conductive contact structure; and
   a third horizontal conductive contact structure that interconnects the conductive support structure and the second resistive sense element.

2. The semiconductor stack of claim 1, further comprising spaced-apart first and second n+ doped regions formed in the base substrate, and first and second vertical conductive support structures that extend upwardly from the respective first and second n+ doped regions to respectively support the first and second horizontal conductive contact structures.

3. The semiconductor stack of claim 2, further comprising a gate structure that spans the first and second n+ doped regions to form an nMOSFET switching device operable to respectively select the first and second resistive sense elements.

4. The semiconductor stack of claim 1, in which the first and second resistive sense elements are each characterized as resistive random access memory (RRAM) memory cells.

5. The semiconductor stack of claim 1, in which the first and second resistive sense elements are characterized as spin-torque transfer random access memory (STRAM) memory cells.

6. The semiconductor stack of claim 1, in which the first and second resistive sense elements each have a nominally common height at a selected elevation above the base substrate, and the conductive contact structure extends between the first and second resistive sense elements upwardly across said common height.

7. The semiconductor stack of claim 1, in which the first and second horizontal conductive contact structures each have a nominally common height at a selected elevation above the base substrate.

8. The semiconductor stack of claim 1, in which the first and second resistive sense elements are connected in series between opposing first and second control lines.

9. A solid-state data storage device, comprising:
   a base substrate of semiconductor material in which spaced-apart, localized first and second doped regions are formed;
   a gate structure supported above the base substrate spanning the first and second doped regions to form a switching device;
   first and second vertical conductive support structures that extend upwardly from the respective first and second doped regions;

first and second horizontal conductive contact structures respectively supported by the first and second vertical conductive support structures;

first and second resistive sense elements respectively supported on the first and second horizontal conductive contact structures;

a third conductive support structure that extends upwardly from the first horizontal conductive contact structure; and a third horizontal conductive contact structure that interconnects the third conductive support structure with the second resistive sense element to form a tortuous path from the first resistive sense element to the second resistive sense element.

10. The solid-state data storage device of claim 9, in which the switching device is characterized as an n-channel MOSFET.

11. The solid-state data storage device of claim 9, further comprising a controller adapted to direct an access operation upon the second resistive sense element to determine a storage state thereof by placing a block select switching element of the device into a conductive state and by placing the switching device into a non-conductive state.

12. The solid-state data storage device of claim 6, in which the first and second resistive sense elements are each characterized as resistive random access memory (RRAM) memory cells.

13. The solid-state data storage device of claim 6, in which the first and second resistive sense elements are characterized as spin-torque transfer random access memory (STRAM) memory cells.

14. The solid-state data storage device of claim 6, in which the first and second resistive sense elements form a portion of a NAND block of non-volatile memory unit cells in a semiconductor memory array.

15. The solid-state data storage device of claim 6, in which the first and second resistive sense elements each have a nominally common height at a selected elevation above the base substrate, and the third horizontal conductive contact structure extends between the first and second resistive sense elements upwardly across said common height.

16. The solid-state data storage device of claim 9, in which the first and second resistive sense elements are connected in series between opposing first and second control lines.

17. A portable storage device comprising:
a semiconductor stack comprising first and second horizontal conductive contact structures supported in spaced-apart relation above a base semiconductor substrate, first and second resistive sense elements respectively supported on the first and second horizontal conductive contact structures, a first conductive support structure that extends upwardly from the first horizontal conductive contact structure, a third horizontal conductive contact structure that interconnects the first conductive support structure and the second resistive sense element, and a switching device operably coupled between the first and second horizontal conductive contact structures, wherein first and second localized doped regions in the base semiconductor substrate are respectively coupled to the first and second horizontal conductive contact structures, and the switching device comprises a gate structure that spans the first and second localized doped regions; and a controller adapted to direct an access operation the second resistive sense element to determine a storage state thereof by placing a block select switching element of the portable storage device into a conductive state and by placing the switching device into a non-conductive state.

18. The portable storage device of claim 17, in which the controller further directs said access operation by passing a read current between a first control line and a second control line, said read current sequentially passing through said first horizontal conductive contact structure, the conductive support structure, the second resistive sense element and the second horizontal conductive contact structure.

19. An apparatus comprising:
first and second horizontal conductive contact structures supported in spaced-apart relation above a base semiconductor substrate;

first and second resistive sense elements respectively supported on the first and second horizontal conductive contact structures, the first and second resistive sense elements connected in series between opposing first and second control lines;

a conductive support structure that extends upwardly from the first horizontal conductive contact structure; and a third horizontal conductive contact structure that interconnects the conductive support structure and the second resistive sense element.

20. The apparatus of claim 19, further comprising a gate structure that spans first and second doped regions in the base semiconductor substrate to form a switching device operable to respectively select the first and second resistive sense elements.

* * * * *